US007193858B2

(12) United States Patent
Suh

(10) Patent No.: US 7,193,858 B2
(45) Date of Patent: Mar. 20, 2007

(54) ORGANIC ELECTROLUMINESCENT DISPLAY DEVICE IN WHICH AN ELECTROMAGNETIC FIELD PREVENTING AND PROTECTING CIRCUIT IS EASILY ARRANGED

(75) Inventor: Mi-Sook Suh, Yongin-si (KR)

(73) Assignee: Samsung SDI Co., Ltd (KR)

( * ) Notice: Subject to any disclaimer, the term of this patent is extended or adjusted under 35 U.S.C. 154(b) by 100 days.

(21) Appl. No.: 10/970,819

(22) Filed: Oct. 20, 2004

(65) Prior Publication Data

US 2005/0088106 A1 Apr. 28, 2005

(30) Foreign Application Priority Data

Oct. 28, 2003 (KR) ...................... 10-2003-0075668

(51) Int. Cl.
*H05K 1/00* (2006.01)

(52) U.S. Cl. ........................................ 361/749; 361/760

(58) Field of Classification Search ............. 315/169.3, 315/85; 361/719, 720, 748, 749, 760
See application file for complete search history.

(56) References Cited

U.S. PATENT DOCUMENTS

| | | | | |
|---|---|---|---|---|
| 5,107,186 | A * | 4/1992 | Ihara | 315/276 |
| 5,508,611 | A * | 4/1996 | Schroeder et al. | 324/252 |
| 6,025,973 | A * | 2/2000 | Mizoshita et al. | 360/98.08 |
| 6,298,730 | B1 * | 10/2001 | Yamagishi et al. | 73/723 |
| 6,528,951 | B2 * | 3/2003 | Yamazaki et al. | 315/169.3 |
| 6,567,363 | B1 * | 5/2003 | Juman et al. | 720/631 |
| 2003/0076049 | A1 * | 4/2003 | Kawada et al. | 315/169.4 |
| 2005/0001905 | A1 * | 1/2005 | Shinomiya | 348/207.99 |
| 2005/0026401 | A1 * | 2/2005 | Shimomura et al. | 438/487 |
| 2005/0104529 | A1 * | 5/2005 | Park et al. | 315/169.3 |
| 2005/0130458 | A1 * | 6/2005 | Simon et al. | 439/67 |
| 2005/0218820 | A1 * | 10/2005 | Tanada | 315/169.3 |
| 2005/0225252 | A1 * | 10/2005 | Ito | 315/169.3 |
| 2006/0006424 | A1 * | 1/2006 | Yamazaki et al. | 257/222 |

* cited by examiner

*Primary Examiner*—Tuyet Vo
*Assistant Examiner*—Tung Le
(74) *Attorney, Agent, or Firm*—Christie, Parker & Hale, LLP

(57) ABSTRACT

An organic electroluminescent display device in which electromagnetic field preventing and protecting circuit, for protecting internal circuits from abnormal signals having specific characteristics generated during manufacturing process or operation, is easily arranged by arranging said circuit on a junction (or coupling) region of a flexible printed circuit (FPC) and an input part. The organic electroluminescent display device includes a substrate, power supply lines and signal lines arranged on the substrate, an input part including input terminals and input lines, each said input line connected between a corresponding one of the power supply lines and the signal lines, and a corresponding one of the input terminals, and an FPC connected to the input terminals. The electromagnetic field preventing and protecting circuit is arranged on a region overlapping with the FPC.

21 Claims, 4 Drawing Sheets

ORGANIC ELECTROLUMINESCENT DISPLAY DEVICE IN WHICH AN ELECTROMAGNETIC FIELD PREVENTING AND PROTECTING CIRCUIT IS EASILY ARRANGED

CROSS REFERENCE TO RELATED APPLICATION

This application claims priority to and the benefit of Korean Patent Application No. 2003-75668, filed on Oct. 28, 2003, the disclosure of which is incorporated herein by reference in its entirety.

BACKGROUND OF THE INVENTION

1. Field of the Invention

The present invention relates to an organic electroluminescent display device, and more particularly, to an organic electroluminescent display device in which an electromagnetic field preventing and protecting circuit, for protecting internal circuits from abnormal signals having specific characteristics that are generated during manufacturing process or operation, is easily arranged by arranging the electromagnetic field preventing and protecting circuit on a junction region of a flexible printed circuit (FPC) in the organic electroluminescent display device.

2. Description of Related Art

Display devices using light emitting elements including organic electroluminescent (EL) device have actively been developed lately. The organic EL device is suitable for a display device having a thin profile and enhanced viewing angles since backlight required in liquid crystal display devices is not required as the organic EL device is a self-emitting display device.

A type of organic EL device has a structure in which an organic thin film layer is formed between the anode that is a transparent electrode such as ITO and the cathode fabricated using a metal having low work function such as Ca, Li and Al. When a forward voltage is applied to the organic EL device, holes and electrons are respectively injected from the anode and the cathode, the injected holes and electrons are combined to form excitons, and the excitons are emitted and recombined to cause electroluminescence.

An organic electroluminescent display device 100 using the above-referenced organic EL device is illustrated in FIG. 1, which is a plan view for showing a conventional organic electroluminescent display device.

The organic electroluminescent display device 100 includes a substrate 110, a power supply voltage line 120, a pixel region 130, a scan driver 140, a data driver 150, a flexible printed circuit (FPC) 160, a cathode voltage line 170 and an input part 190.

The pixel region 130 is laid up on the substrate 110, and an image is displayed on a front surface of the pixel region 130. The power supply voltage line 120 is used to transmit a power supply voltage to the pixel region 130, and the cathode voltage line 170 is used to supply a cathode voltage to the pixel region 130. The scan driver 140 outputs selection signals to the pixel region 130, and the data driver 150 outputs data signals to the pixel region 130. The FPC 160 is connected to the input part 190 of the respective power supply and cathode voltage lines 120, 170 as well as signal lines to transmit external signals.

As illustrated in FIG. 1, the organic electroluminescent display device 100 is formed by depositing respective wirings and drivers on the substrate 110. The power supply voltage line 120 in the respective wirings is arranged on the outskirts of the pixel region 130 to transmit the power supply voltage to the pixel region 130. In addition, the cathode voltage line 170 is connected to the pixel region 130 at one side of the pixel region 130 so that the cathode voltage is transmitted to the pixel region 130. The scan driver 140 is formed at the other side of the pixel region 130, and the data driver 150 is formed at a position adjacent to the input part 190 of the organic electroluminescent display device 100.

Therefore, when a driving control signal is transmitted to the scan driver 140 and the data driver 150 from the FPC 160, the scan driver 140 and the data driver 150 apply selection signals and data signals, respectively, to the pixel region 130 according to the driving control signal applied. Since unit pixels (not shown) of the pixel region 130 are turned on according to the applied selection signals and data signals, the power supply voltage and the cathode voltage, respectively, of the power supply voltage line 120 and the cathode voltage line 170 are applied to the pixel region 130 so that the respective unit pixels emit light of certain colors.

The organic electroluminescent display device 100 is exposed to electrostatic discharge having high instantaneous voltage by various causes. Since gate insulation film breakage or junction sparking of metal oxide semiconductor (MOS) field effect transistor device inside a semiconductor device is generated under the circumstances, the device is completely broken or finely damaged so that reliability of the device is severely influenced. Therefore, it is important to design to prevent the gate insulation film breakage or junction sparking during the development stage of the organic electroluminescent display device.

In order to solve this problem, an electromagnetic field preventing circuit for preventing damage of internal circuits, created by connecting diodes between signal line and power line of the organic electroluminescent display device and discharging static electricity through the diodes has been suggested as illustrated in FIG. 2.

FIG. 2 is a plan view for showing an arrangement of one such conventional electromagnetic field preventing circuit.

As illustrated in FIG. 2, a plurality of thin film transistors are diode-connected in a conventional electromagnetic field protecting circuit 180. The conventional electromagnetic field protecting circuit 180 is connected between the input lines 191 of the power supply line or the signal line at a region outside the junction (or coupling) region of the FPC 160 and the input part 190 of the organic electroluminescent display device 100.

The electromagnetic field protecting circuit 180 equalizes charge of both sides by discharging charge generated at one side having higher charge to the other side if a charge difference is generated in which one side of the neighboring lines or one side of the same line has higher charge during manufacturing process while the other side has lower charge. Further, the electromagnetic field protecting circuit 180 prevents damage of internal circuits due to instantaneous voltage by discharging a residual voltage obtained by subtracting the total threshold voltage of the respective diode-connected thin film transistors from the generated electrostatic discharge from one side of the line to the other side of the line when electrostatic discharge is generated at one side of line during operation of the organic electroluminescent display device 100.

An arrangement region for the electromagnetic preventing and protecting circuit formed at the input part is limited since region of the input part becomes very crowded as a plurality of signal lines and power supply lines are ordinarily arranged on a limited region of the input part of the organic electroluminescent display device. Further, distances between the wirings are non-uniform due to the mixture of a distance having a wide width between the respective wirings and a distance having a narrow width between the wirings since respective wirings of signal lines and power supply lines of an organic electroluminescent display device are concentrated in a limited region so that the signal lines and power supply lines should be connected to input terminals and pads respectively.

Further, the construction region of the electromagnetic field preventing and protecting circuits is limited since input lines having obtuse angle or acute angle at a certain position are formed in the wirings. Therefore, the electromagnetic field preventing and protecting circuit of a conventional organic electroluminescent display device has problems in that the arrangement region of the electromagnetic field preventing and protecting circuit is very restricted since the electromagnetic field preventing and protecting circuit can be constructed only on a region where respective lines are vertically arranged as illustrated in FIG. 2.

SUMMARY OF THE INVENTION

Therefore, in order to solve the foregoing problems of the prior art, in one exemplary embodiment of the present invention is provided an organic electroluminescent display device for easily arranging an electromagnetic field preventing and protecting circuit capable of improving space and arrangement efficiencies by constructing the electromagnetic field preventing and protecting circuit on a coupling region of an input part and a flexible printed circuit (FPC) of an organic electroluminescent display device irrespective of the arrangement region of the respective wirings.

In an exemplary embodiment of the present invention, an organic electroluminescent display device includes a substrate, and a plurality of power supply lines and signal lines arranged on the substrate. An input part includes a plurality of input terminals and a plurality of input lines, each said input line connected between a corresponding one of the power supply lines and the signal lines, and a corresponding one of the input terminals. An FPC is connected to the input terminals. An electromagnetic field preventing and protecting circuit is arranged on a region overlapping with the FPC. The electromagnetic field preventing and protecting circuit may be arranged on a coupling region of the FPC and the input part.

Further, the electromagnetic field preventing and protecting circuit may be connected between a first said input terminal connected to a first said input line and a second said input line.

In addition, the electromagnetic field preventing and protecting circuit may be connected between a first said input line and a second said input line.

Further, the electromagnetic field preventing and protecting circuit may be connected between a first said input terminal and a second said input terminal.

The electromagnetic field preventing and protecting circuit may be a diode ring having a plurality of diode-connected thin film transistors.

In another exemplary embodiment of the present invention, an organic electroluminescent display device includes a substrate having a pixel region formed thereon, and a plurality of power supply lines and signal lines arranged on the substrate and connected to the pixel region. An input part includes a plurality of input terminals, each coupled to a corresponding one of the power supply lines and the signal lines. A flexible printed circuit is connected to the input terminals, and an electromagnetic field preventing and protecting circuit is arranged on a junction region of the flexible printed circuit and the input part.

In yet another exemplary embodiment of the present invention, is provided a method of discharging a charge in an organic electroluminescent display device including a substrate having a pixel region formed thereon, a plurality of power supply lines and signal lines arranged on the substrate and connected to the pixel region, an input part including a plurality of input terminals, each said input terminal coupled to a corresponding one of the power supply lines and the signal lines, and a flexible printed circuit connected to the input terminals. The method includes arranging an electromagnetic field preventing and protecting circuit on a junction region of the flexible printed circuit and the input part.

BRIEF DESCRIPTION OF THE DRAWINGS

The above and other features of the present invention will become more apparent to those of ordinary skill in the art with the following description in detail of certain exemplary embodiments with reference to the attached drawings in which.

DETAILED DESCRIPTION

Figure 1:
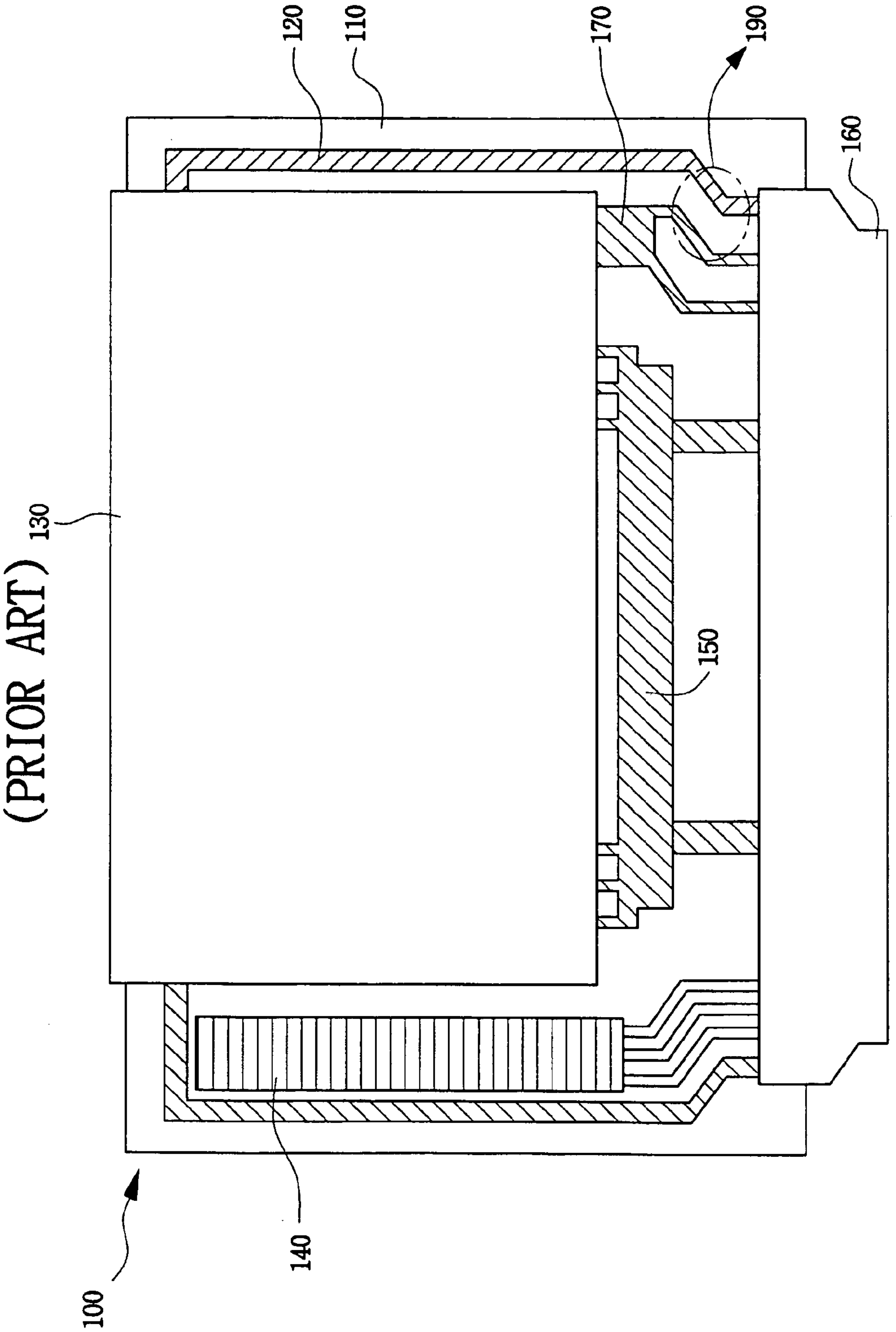
FIG. 1 (PRIOR ART)
FIG. 1 is a plan view showing a conventional organic electroluminescent display device.
Figure 2:
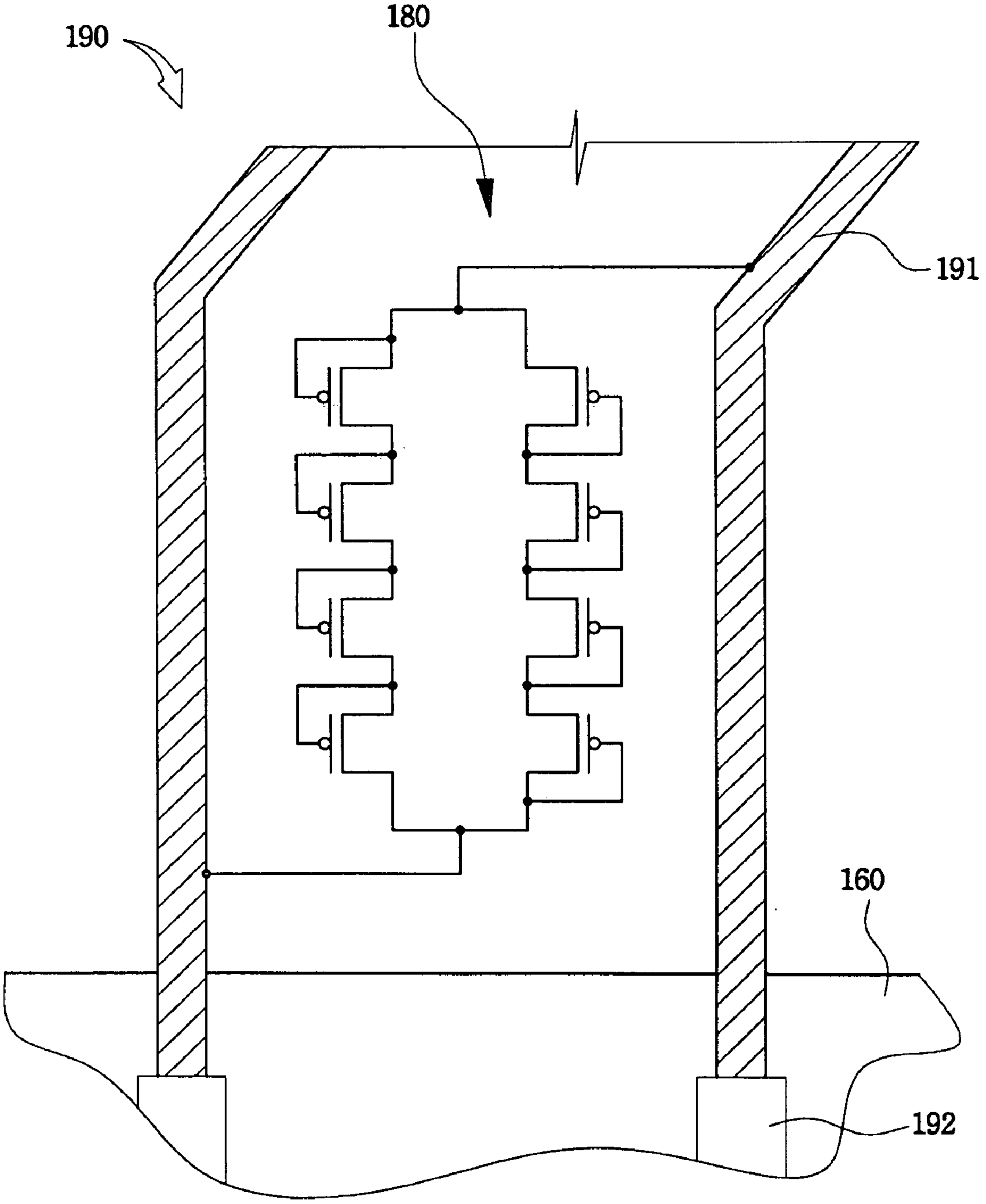
FIG. 2 (PRIOR ART)
FIG. 2 is a plan view showing an arrangement structure of a conventional electromagnetic field preventing and protecting circuit.

The present invention will now be described in detail in connection with certain exemplary embodiments with reference to the accompanying drawings. In the drawings, like reference numerals/characters designate like elements.

Figure 3:
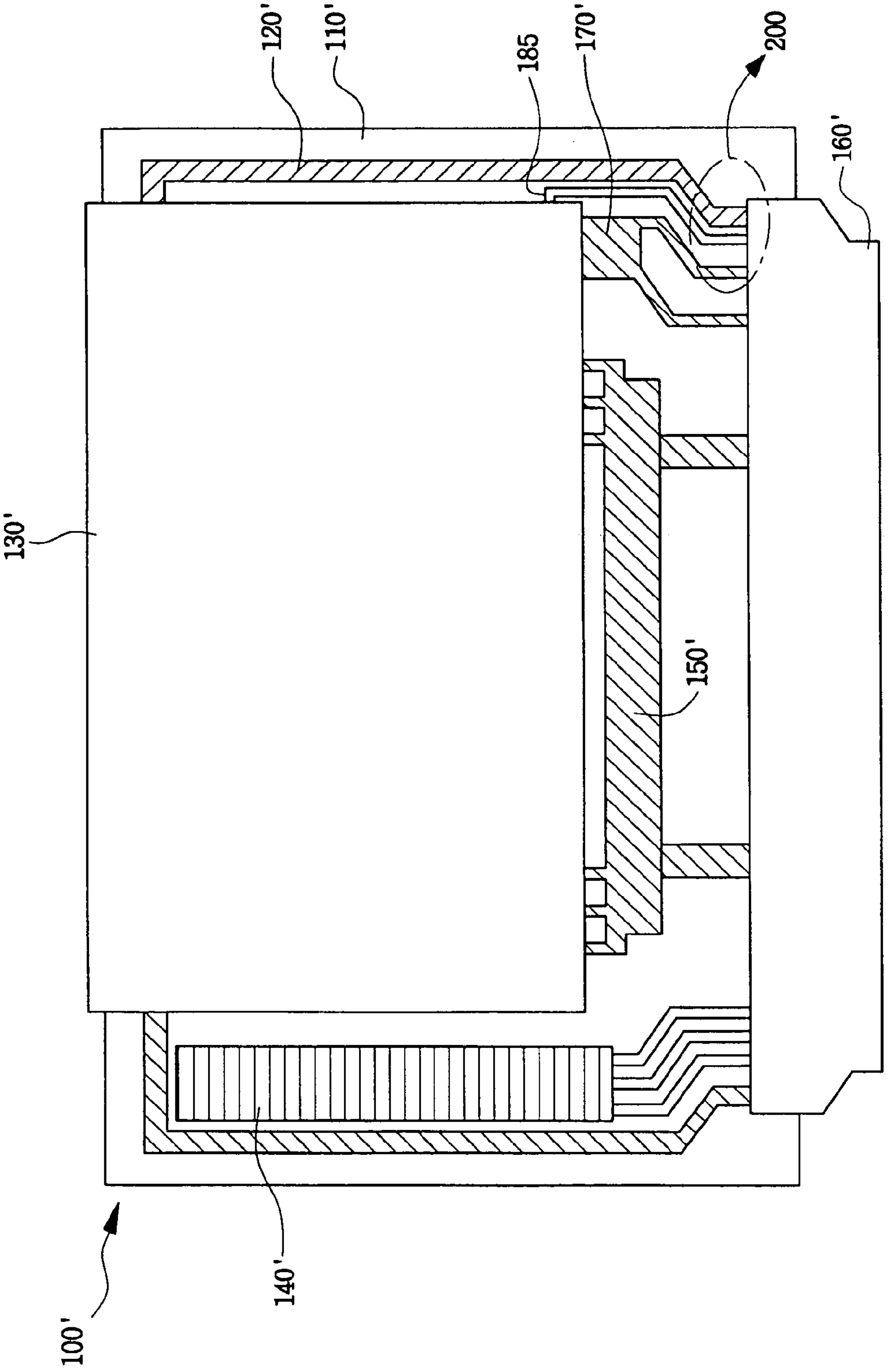
FIG. 3 is a plan view showing an organic electroluminescent display device according to an exemplary embodiment of the present invention.

In FIG. 3, an organic electroluminescent display device 100' includes a substrate 110', a power supply voltage line 120', a pixel region 130', a scan driver 140', a data driver 150', an FPC 160' and a cathode voltage line 170' that have substantially the same relationship with respect to each other as the corresponding components of the conventional organic electroluminescent display device 100 of FIG. 1.

The organic electroluminescent display device 100' is different from the conventional organic electroluminescent display device 100 in that an electromagnetic field preventing and protecting circuit is formed in a junction (or coupling) region between of the FPC 160' and an input part 200. Also shown in FIG. 3 are signal lines 185, which are shown for illustrative purposes only. The organic electroluminescent display device 100' may also include additional power supply lines and/or signal lines.

Figure 4:
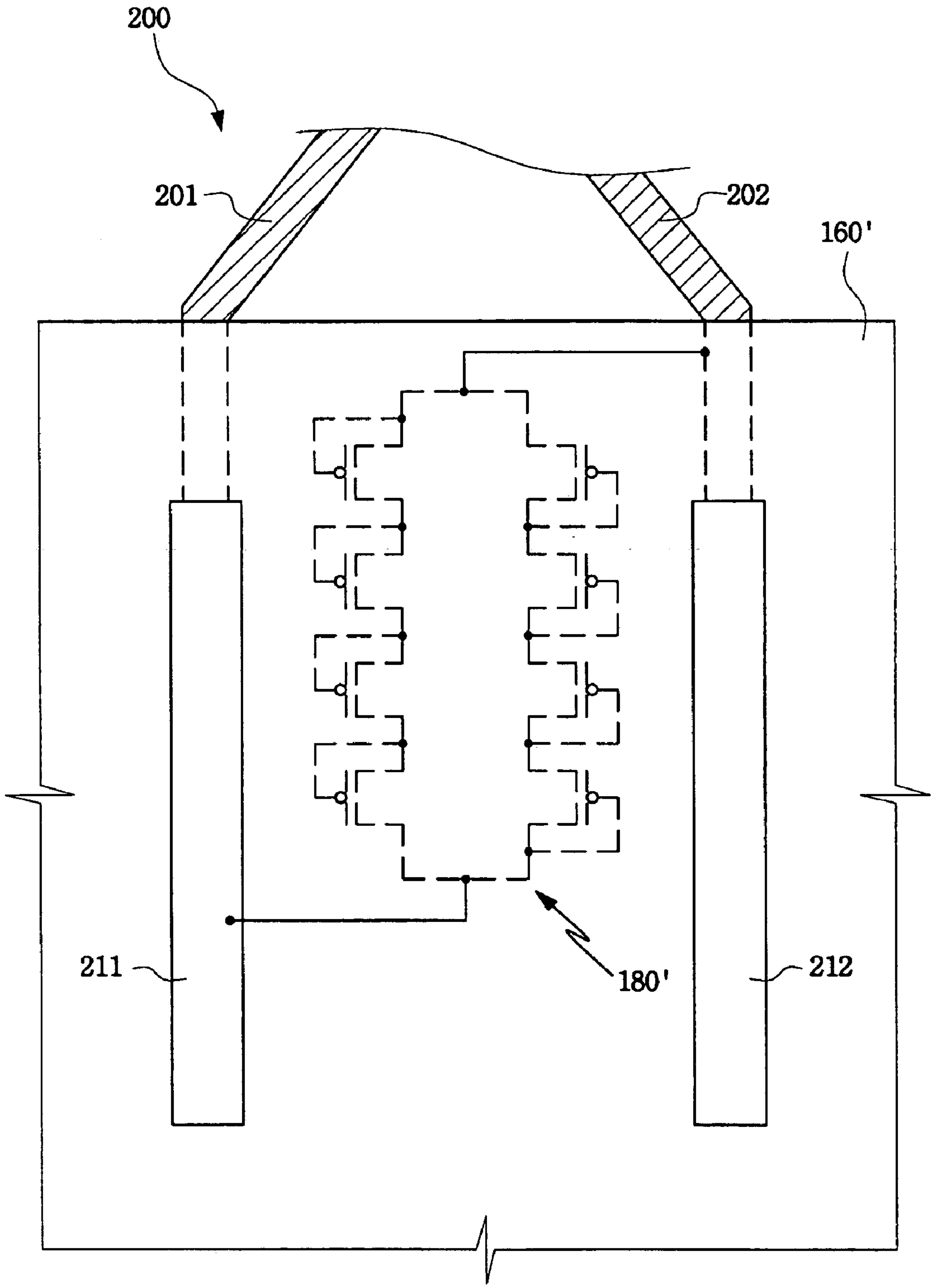
FIG. 4 is a plan view showing an arrangement structure of an electromagnetic field preventing and protecting circuit in the organic electroluminescent display device of FIG. 3.

As illustrated in FIG. 4, the input part 200 of power supply lines or signal lines includes input lines 201, 202 connected to the respective signal lines or power supply lines, and input terminals 211, 212 which are formed at longitudinal ends of the input lines 201, 202 and connected to or contacted with the FPC 160' so that the input part 200 of the power supply lines or signal lines is connected to the FPC 160'. The input terminals 211, 212 are vertically arranged to correspond to the coupling structure of the FPC 160'. In addition, the electromagnetic field preventing and protecting circuit 180' is connected between the input lines 201, 202 and input terminals 211, 212 of the power supply lines or signal lines of both sides inserted into thus coupled to the FPC 160'.

It should be noted that while only two input lines 201, 202 are illustrated in FIG. 4, the input lines 201 and 202 represent only two of the plurality of input lines connected to the power supply lines or the signal lines. Further, each of the input lines 201, 202 may be connected to any suitable one of the power supply lines and the signal lines. Further, the electromagnetic preventing and protecting circuit 180' illustrated in FIG. 4 may represent one of a plurality of electromagnetic preventing and protecting circuits, each coupled between any suitable two of the power supply lines and the signal lines.

As described above, the input part 200 of the respective power supply lines or signal lines includes the first input line 201, the first input terminal 211 connected to the first input line 201, the second input line 202, and the second input terminal 212 connected to the second input line 202. The input lines 201, 202 and the input terminals 211, 212 are vertically arranged from a certain position coupled to the FPC 160'. Therefore, the vertically arranged input lines 201, 202 and the input terminals 211, 212 are inserted into the FPC 160'. A coupling device (not shown) of the FPC 160' is coupled to or closely adhered to the input terminals 211, 212 so that control signals or outer power supply from an external control device is transmitted to respective lines wired in the organic electroluminescent display device through the FPC 160'.

Since the electromagnetic field preventing and protecting circuit 180' is connected between the second input line 202 and the first input terminal 211 shown in FIG. 4, it is formed between the respective lines of the input part 200. Hence, the electromagnetic field preventing and protecting circuit 180' is included in the coupling region of the FPC 160'. Alternatively, the electromagnetic field preventing and protecting circuit 180' may be connected between the first input terminal 211 and the second input terminal 212 in such a way that the electromagnetic field preventing and protecting circuit 180' is arranged between the first input terminal 211 and the second input terminal 212.

Although FIG. 4 shows that the vertical length of input terminals 211, 212 in a coupling region of the input part 200 and the FPC 160' is longer than that of the input lines 201, 202, alternatively, the length of the input lines 201, 202 may be longer than that of the input terminals 211, 212 due to intention of designer or difference of coupling structure. In this case, the electromagnetic field preventing and protecting circuit 180' may be connected between the first input line 201 or the second input line 202 and the first input terminal 211 or the second input terminal 212, or the electromagnetic field preventing and protecting circuit 180' may be connected between the first input line 201 and the second input line 202.

Therefore, a problem that the arrangement region of the conventional electromagnetic field preventing and protecting circuit is limited by the distance between respective input lines and forming angle of wirings can be solved.

It can also be seen in FIG. 4 that the electromagnetic field preventing and protecting circuit 180' is connected between vertically arranged portions of the first input terminal 211 and the second input line 202. Additional electromagnetic field preventing and protecting circuits may also be connected between vertically arranged portions of the input lines and the input terminals of the input part not illustrated in FIG. 4.

As described above, the organic electroluminescent display device according to the present invention obtains effects of easy design operation and simple working process since the electromagnetic field preventing and protecting circuit is easily arranged irrespective of wiring angle and distance of the respective lines by arranging the electromagnetic field preventing and protecting circuit on a coupling region of the input part of power supply lines or signal lines and FPC.

While the invention has been particularly shown and described with reference to certain embodiments thereof, it will be understood by those skilled in the art that the foregoing and other changes in form and details may be made therein without departing from the spirit and scope of the invention. The scope of the present invention is indicated by the appended claims, and all changes that come within the meaning and range of equivalents thereof are intended to be embraced therein.

What is claimed is:

1. An organic electroluminescent display device comprising a substrate; a plurality of power supply lines and signal lines arranged on the substrate; an input part comprising a plurality of input terminals and a plurality of input lines, each said input line connected between a corresponding one of the power supply lines or the signal lines and a corresponding one of the input terminals; and a flexible printed circuit connected to the input terminals, wherein an electromagnetic field preventing and protecting circuit is arranged on a region overlapping with the flexible printed circuit.

2. The organic electroluminescent display device according to claim 1, wherein the electromagnetic field preventing and protecting circuit is arranged on a coupling region of the flexible printed circuit and the input part.

3. The organic electroluminescent display device according to claim 1, wherein the electromagnetic field preventing and protecting circuit is connected between a first said input terminal connected to a first said input line, and a second said input line.

4. The organic electroluminescent display device according to claim 1, wherein the electromagnetic field preventing and protecting circuit is connected between a first said input line and a second said input line.

5. The organic electroluminecent according to claim 1, wherein the electromagnetic field preventing and protecting circuit is connected between a first said input terminal and a second said input terminal.

6. The organic electroluminescent display device according to claim 1, wherein the electromagnetic field preventing and protecting circuit is a diode ring having a plurality of diode-connected thin film transistors.

7. The organic electroluminescent display device according to claim 1, wherein the electromagnetic field preventing and protecting circuit is adapted to discharge a static electricity.

8. An organic electroluminescent display device comprising a substrate having a pixel region formed thereon;

a plurality of power supply lines and signal lines arranged on the substrate and connected to the pixel region;

an input part including a plurality of input terminals, each coupled to a corresponding one of the power supply lines or the signal lines;

a flexible printed circuit connected to the input terminals; and an electromagnetic field preventing and protecting circuit arranged on a junction region of the flexible printed circuit and the input part.

9. The organic electroluminescent display device of claim 8, wherein the input part further comprises a plurality of input lines, each connected between the corresponding one of the power supply lines or the signal lines and a corresponding one of the input terminals.

10. The organic electroluminescent display device of claim 9, wherein the elecetromagnetic field preventing and protecting circuit is connected between two of the input lines.

11. The organic electroluminescent display device of claim 9, wherein the electromagnetic field preventing and protecting circuit is connected between one of the input lines and one of the input terminals.

12. The organic electroluminescent display device of claim 9, wherein the electromagnetic field preventing and protecting circuit is connected between two of the input terminals.

13. The organic electroluminescent display device of claim 9, wherein the length of the input lines is greater than the length of the input terminals.

14. The organic electroluminescent display device of claim 9, wherein the length of the input terminals is greater than the length of the input lines.

15. The organic electroluminescent display device of claim 8, wherein the electromagnetic field preventing and protecting circuit includes a plurality of diode-connected transistors arranged in a diode ring configuration.

16. A method of discharging a charge in an organic electroluminescent display device comprising a substrate having a pixel region formed thereon, a plurality of power supply lines and signal lines arranged on the substrate and connected to the pixel region, an input part including a plurality of input terminals, each said input terminal coupled to a corresponding one of the power supply lines or the signal lines, and a flexible printed circuit connected to the input terminals, the method comprising arranging an electromagnetic field preventing and protecting circuit on a junction region of the flexible printed circuit and the input part.

17. The method of claim 16, further comprising connecting each of a plurality of input lines in the input part between the corresponding one of the power supply lines or the signal lines and a corresponding one of the input terminals.

18. The method of claim 17, wherein said arranging comprises connecting the electromagnetic field preventing and protecting circuit between two of the input lines.

19. The method of claim 17, wherein said arranging comprises connecting the electromagnetic field preventing and protecting circuit between one of the input lines and one of the input terminals.

20. The method of claim 17, wherein said arranging comprises connecting the electromagnetic field preventing and protecting circuit between two of the input terminals.

21. The method of claim 16, wherein said arranging comprises arranging a plurality of diode-connected transistors in a diode ring configuration.

* * * * *

UNITED STATES PATENT AND TRADEMARK OFFICE

CERTIFICATE OF CORRECTION

PATENT NO. : 7,193,858 B2
APPLICATION NO. : 10/970819
DATED : March 20, 2007
INVENTOR(S) : Suh It is certified that error appears in the above-identified patent and that said Letters Patent is hereby corrected as shown below:

| | |
|---|---|
| Column 6, line 43, Claim 5 | After "electroluminescent",<br>Insert --display device-- |
| Column 7, line 7, Claim 10 | Delete "elecetromagnetic",<br>Insert --electromagnetic-- |

Signed and Sealed this

Twentieth Day of May, 2008

JON W. DUDAS
*Director of the United States Patent and Trademark Office*